United States Patent
Fahs

(10) Patent No.: US 8,044,756 B2
(45) Date of Patent: Oct. 25, 2011

(54) PROGRAMMABLE INDUCTOR

(75) Inventor: Bassem Fahs, Mondeville (FR)

(73) Assignee: ST-Ericsson SA, Geneva (CH)

( * ) Notice: Subject to any disclaimer, the term of this patent is extended or adjusted under 35 U.S.C. 154(b) by 42 days.

(21) Appl. No.: 12/306,642

(22) PCT Filed: Jul. 4, 2007

(86) PCT No.: PCT/IB2007/052611
§ 371 (c)(1),
(2), (4) Date: Jul. 24, 2009

(87) PCT Pub. No.: WO2008/007307
PCT Pub. Date: Jan. 17, 2008

(65) Prior Publication Data
US 2010/0066473 A1  Mar. 18, 2010

(30) Foreign Application Priority Data
Jul. 7, 2006  (EP) ..................... 06300777

(51) Int. Cl.
*H01F 5/00* (2006.01)
*H01F 7/06* (2006.01)
(52) U.S. Cl. ........ 336/200; 336/223; 336/232; 29/602.1
(58) Field of Classification Search .................. 336/200, 336/223, 232
See application file for complete search history.

(56) References Cited

U.S. PATENT DOCUMENTS

| 6,476,704 | B2* | 11/2002 | Goff .............................. 336/200 |
| 7,642,891 | B2* | 1/2010 | Einzinger et al. ............. 336/226 |
| 2005/0052272 | A1 | 3/2005 | Tiebout |
| 2005/0195063 | A1 | 9/2005 | Mattsson |
| 2006/0033602 | A1 | 2/2006 | Mattsson |
| 2007/0052512 | A1* | 3/2007 | Jeon et al. ..................... 336/200 |
| 2007/0158782 | A1* | 7/2007 | Heikkinen .................... 257/531 |
| 2008/0129390 | A1* | 6/2008 | Hung et al. ..................... 331/16 |
| 2008/0129434 | A1* | 6/2008 | Khajehpour ................... 336/139 |

OTHER PUBLICATIONS

Park et al., Variable Inductance Multilayer Inductor With MOSFET Switch Control, Mar. 2004, IEEE Electron Device Letters, vol. 25, No. 3.*
PCT International Search Report, PCT/IB2007/052611, mailing date May 12, 2007.

* cited by examiner

*Primary Examiner* — Anh Mai
(74) *Attorney, Agent, or Firm* — William J. Kubida; Peter J. Meza; Hogan Lovells US LLP

(57) ABSTRACT

The present invention provides a programmable integrated inductor having a compact design, having a dual turn and a parallel programmable impedance. In particular, the impedance value of the programmable changes, like a variable, programmable, as its range may be set to an unlimited number of values. The invention, thus, provides a wider range of programmable values without compromising space, at a constant equivalent given inductor area.

16 Claims, 6 Drawing Sheets

PROGRAMMABLE INDUCTOR

CROSS-REFERENCE TO RELATED APPLICATIONS

The present application is a national filing in the U.S. Patent & Trademark Office of PCT/IB2007/052611 filed Jul. 4, 2007, and claims priority of EPO Patent Application No. 06300777.7 filed Jul. 7, 2006, both of which applications are incorporated herein in their entireties by this reference.

FIELD OF THE INVENTION

The present invention relates to the field of programmable integrated inductors. In particular, the invention relates to providing a wide programmable inductance range within a compact area.

BACKGROUND OF THE INVENTION

Programmable inductors are essential components in Radio Frequency (RF) circuits in the domains of telecommunications, mobile communications, wireless local area networks (WLAN), TV, networking and so on. With such devices, many useful applications may be implemented, such as programmable voltage controlled oscillators (VCO), programmable filters, output buffers using a programmable overshoot or boost, programmable features, i.e., gain, linearity, matching networks, in circuits like LNAs (Low Noise Amplifiers), mixers, power amplifiers and the like.

A traditional programmable inductor includes many inductors and switches in order to achieve the programmability function. For example, referring to FIG. 1, a schematic diagram illustrates a conventional programmable inductor implementation using multi-inductors technique with switches.

In particular, an exemplary programmable inductor 100 is shown having two conductors 102 and 104 and two switches 106 and 108. When the switches 106 and 108 are both connected, the inductors 102 and 104 are connected to the inductor terminals in parallel. When either of the switches 106 and 108 have been disconnected, only inductor 102 is connected to the inductor terminals. Therefore, with the control of the switches 106 and 108, inductors 102 and 104 may be connected to the inductor terminals in different configurations. Consequently, two different inductor values may be obtained in the inductor terminals, and the inductance value of this inductor is programmable.

However, this type of programmable inductor presents a number of limitations. The programmable inductor 100 takes too much area space because the inductor number increases with the number of programmable values. Therefore, when an area of an inductor is limited, the programmable values range are also limited. Furthermore, because of the large area, an inductor's radiations and magnetic coupling with other blocks or devices also increase, causing further performance degradations.

For example, to address the above drawbacks, various solutions have been advanced. One solution presented in, namely, US Patent Application 2006/0033602 A1, proposes a variable integrated inductor which has an inductance value that may be switched between two or more values. This reference proposes a principle based on the coupling between a primary inductor and a secondary one, the last being programmable with switches, which makes the coupling itself variable and as a result, the value of the primary inductor also varies.

However, in this type of variable integrated inductor, in one scenario where many secondary inductor pairs are disposed in a plan with each one placed near one another, the inconvenience of spatial extension and increasing coupling and radiation issues are present. In another scenario where these secondary inductor pairs are superposed over each other, there is no area issue which can be invoked. Further, another limitation arises resulting from the parasitic capacitors between the secondary inductors and the substrate on a side, and the primary inductor and the secondary inductors on the other side. These parasitic capacitors define the own resonance frequency of the primary and secondary inductors. The higher the capacitors are, the lower are the resonance frequencies, and an inductor may not be used at a frequency close or inferior to its resonance frequency. Therefore, there is a limitation on the frequency of use, resulting primarily from the superposition of many inductors, which may affect either the primary or the secondary inductors. Consequently, the increase of the programmability range may not be implemented without giving an upward limitation on the utilization frequency of a given programmable inductor.

Therefore, in view of these concerns, there is a continuing need for developing a new and improved programmable integrated inductor which would avoid the disadvantages and above mentioned problems while being cost effective and simple to implement.

OBJECT AND SUMMARY OF THE INVENTION

Accordingly, it is an object of the present invention to provide an improved programmable inductor as indicated according to claim 1. In particular, the invention includes a programmable integrated inductor including a dual-turn inductor with at least one inner turn and at least one outer turn, where a current generated by the inner and the outer turn have the same direction, and at least one parallel programmable impedance configured to change an impedance value and an inductance value of the inductor, where the impedance value is a variable based as a function of a digital or an analog signal and the inductance value is programmable so that its range may be set to an unlimited number of values.

One or more of the following features may also be included.

In one aspect of the invention, the current in the inner turn is configured to generate a magnetic field $B_1$ and the current in the outer turn is configured to generate a magnetic field $B_2$.

In yet another aspect, the range of values of the programmable inductor is configured to increase without increasing inductor dimensions.

In another aspect, dual-turn inductor includes N number of turns, or the dual-turn inductor includes a FIG. 8 shape and further includes at least one lower dual-turn and at least one upper dual-turn.

Embodiments may have one or more of the following advantages.

Advantageously, the present programmable integrated inductor may be implemented in a compact area, taking no more chip area than that required by traditional fixed inductors. Thus, compact design and space saving is achieved with an important area ratio saving. Further, the present invention increases the programmable inductance values range at a constant area. This new inductor area being relative to its maximum programmable value, the area saving results because there is no need to add other auxiliary or supplementary inductors to get access to lower inductor values. This permits the use of a single compact device rather than using many devices.

Furthermore, due mainly to the area limitation, the inductor layouts have reduced magnetic radiations and coupling. Thus, the area savings also results in an improvement of magnetic coupling properties. In other words, the limitation of the spatial extension considerably improves the sensitivity regarding the received and emitted radiations. This avoids high magnetic coupling or radiations issues in circuits containing separate and switchable inductors, which are caused mainly by the spatial extension of these conventional inductors. Thus, coupling properties are significantly improved.

Additionally, the programmable integrated inductor provides an inductance value that can be set to any value by changing the inductance value of parallel impedances. With this inductance value, it is possible to obtain either a continuous or a discrete law with the control signals. Further, the analog programmability option is also possible around any inductor value, being digitally programmable. Thus, it is possible to have either digital or analog programmability.

Furthermore, the invention advantageously provides a novel programmable inductor with a wide range of programmable values, providing a higher programmability range for a given and equivalent inductor area, as well as maximum frequency of utilization whereby the utilization of the programmable inductor can be carried out at much higher frequencies.

Another added value for devices implementing programmable inductors is the ability to facilitate front-end convergence solutions, such as making single-block LNAs or mixers compatible with many RF bands or standards requirements, mainly on gain and linearity parameters (IIP2, IIP3), or unifying many matching networks into a single structure that may be adapted to the desired RF band only by changing the inductor value. Any type of filters using inductors may also be easily adapted in their characteristics by using such programmable inductors.

These and other aspects of the invention will become apparent from and elucidated with reference to the embodiments described in the following description, drawings and from the claims.

DESCRIPTION OF EMBODIMENTS

Figure 1:
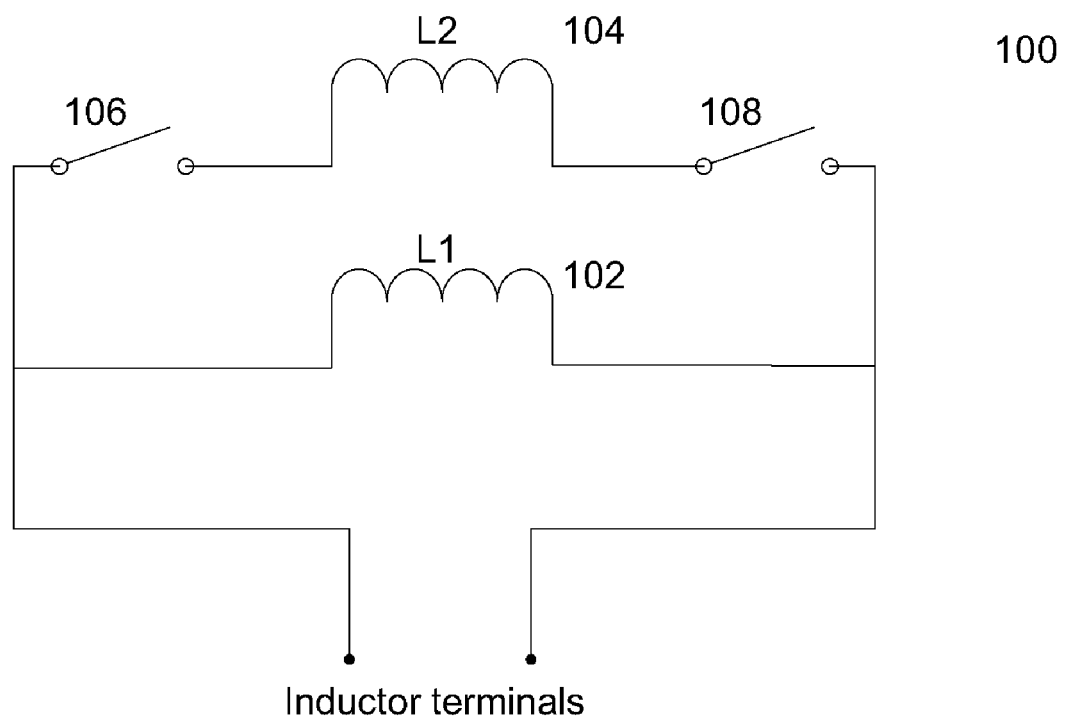
FIG. 1 is a schematic diagram illustrating a traditional programmable inductor implementation using a multi-inductor assembly with switches.
Figure 2:
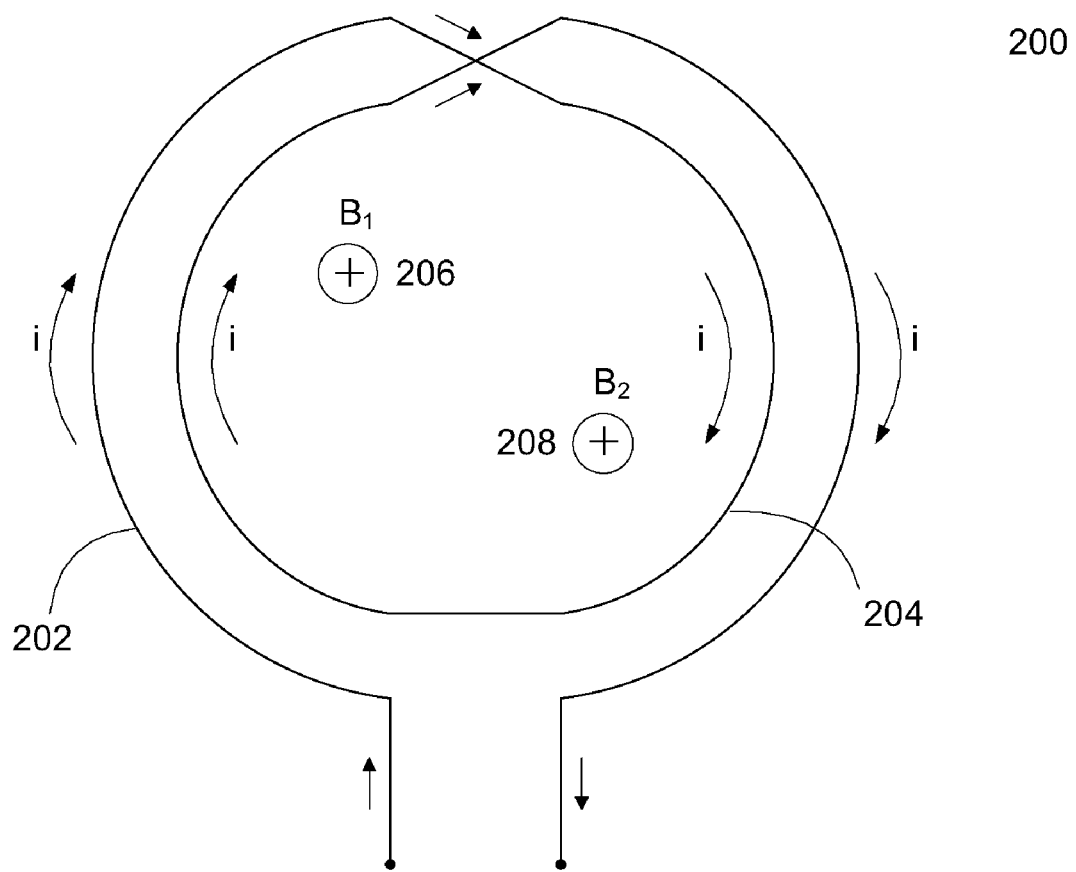
FIG. 2 is a schematic diagram illustrating a fixed dual-turn inductor, illustrating the implementation of an improved method and system according to one of the embodiments of the present invention.

Referring to FIG. 2, a schematic diagram illustrates a fixed dual-turn inductor 200. The inductor 200 includes an outer turn 202 and an inner turn 204. With the structure of the dual-turn inductor 200, the current in the outer turn 202 travels in the same direction as the current in the inner turn 204. In FIG. 2, it can be seen that both the outer turn 202 and the inner turn 204 are turning clockwise, as indicated by the arrows. Consequently, the current in the outer turn 202 generates a magnetic field $B_1$ 206 and the current in the inner turn 204 generates a magnetic field $B_2$ 208.

The magnetic flux generated by each turn may be defined by the following equation:

$$\Phi_k = \iint \vec{B}_k \vec{d}S \ (k=1, 2) \qquad \text{[Equation No. 1]}$$

As magnetic fields $B_1$ 206 and $B_2$ 208 have the same directions, the total magnetic flux inside the dual-turn inductor 200 is the addition of the magnetic flux $\Phi_1$ and $\Phi_2$, where $\Phi_1$ is the magnetic flux calculated from the magnetic field $B_1$ 206 by Equation No. 1 and $\Phi_2$ is the magnetic flux calculated from the magnetic field $B_2$ 208. The inductance value of the fixed dual-turn inductor 200 may be defined as follows:

$$L = \Phi_{tot}/i = (\Phi_1 + \Phi_2 + \ldots + \Phi_k)/i \qquad \text{[Equation No. 2]}$$

Figure 3:
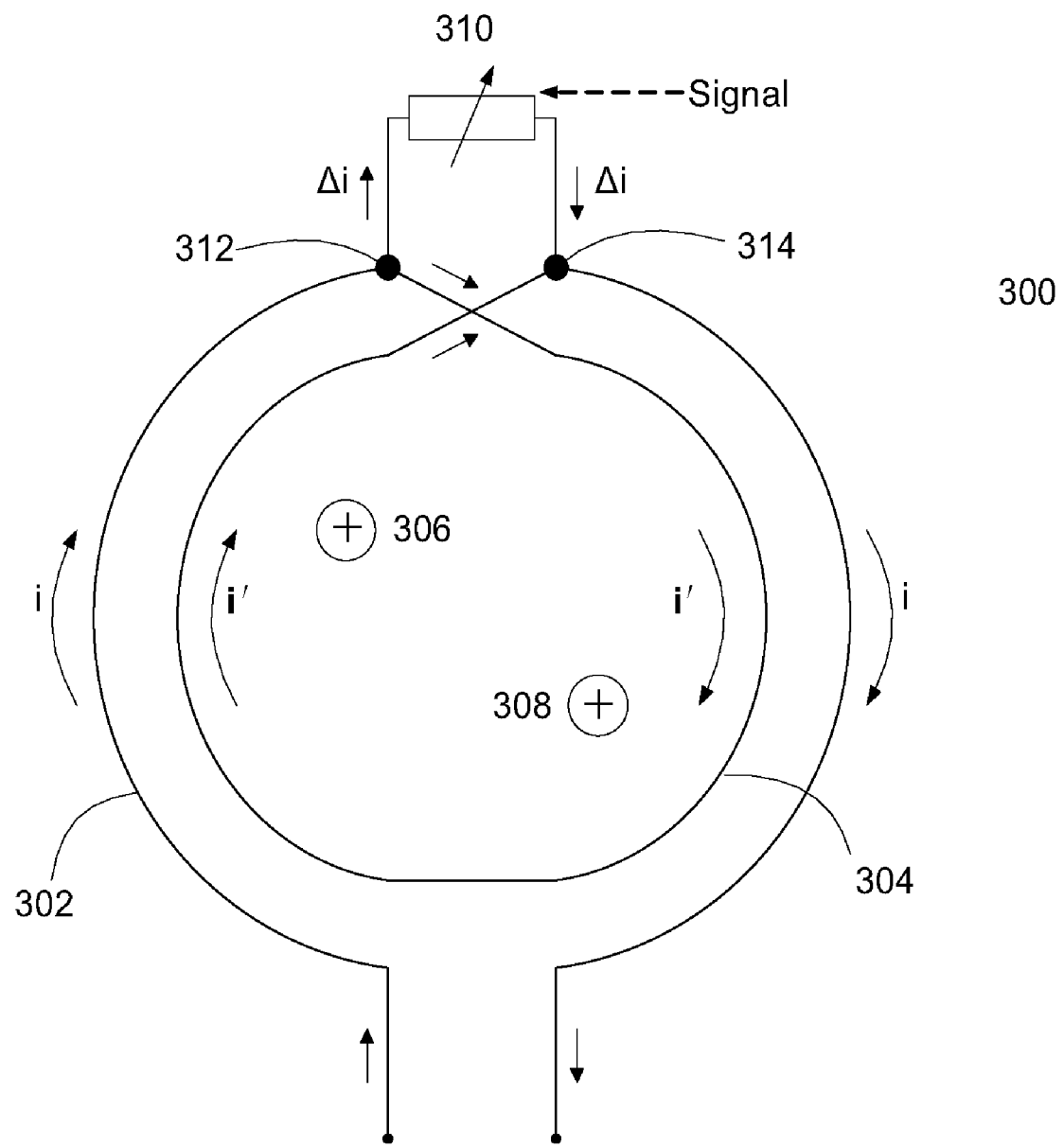
FIG. 3 is a schematic diagram illustrating a programmable dual-turn inductor, according to one of the embodiments of the present invention.

Referring now to FIG. 3, a schematic diagram illustrates a programmable dual-turn inductor 300, which includes a dual-turn inductor outer turn 302 and an inner turn 304 with a parallel programmable impedance 310. The structure of the dual-turn inductor 300 is the same as the fixed dual-turn inductor 200.

If the current in the outer turn 302 has the same value and direction as the current in the outer turn 202 as shown in FIG. 2, the current in the inner turn 304 is lower than the current in the inner turn 204 of the fixed dual-turn inductor 200 of FIG. 2. The current i is separated into two branches at point 312 where one branch i' crosses over to the inner turn 304 and another Δi proceeds to go through the impedance 310. These two branches then combine at point 314. The current i' is given by following equation:

$$i' = i - \Delta i \qquad \text{[Equation No. 3]}$$

The current i' in the inner turn 304 is lower than the current i in the inner turn 204 of FIG. 2. A generated magnetic field 308 of the inner turn 304 is lower than the generated magnetic field 208. As indicated by the Equation No. 1, the magnetic flux generated by the inner turn 204 is lower. Referring then to Equation No. 2, since the value of current i is fixed, the inductance value of the inductor 300 will be lower than that of the inductor 200.

By making the impedance value of the impedance 310 vary as a function of a digital or an analog signal, the inner current i' may be modulated. When the impedance value of 310 is changed, Δi is changed, then i' is similarly modified based on Equation No. 3. According to Equations No. 1 and No. 2, the current i', the magnetic field, the total flux, and the inductance value may be modulated. In this way, regardless of a discrete or a continuous law, the inductance value can be realized as a function of the control signal. The analog programmability option is possible around any inductor value, being digitally programmable. And the inductance value may be set to as many values as desired in the available range.

The variable impedance may be realized with a programmable trans-conductance or impedance, e.g., a MOS device, with a voltage signal controlling the gate. The variable impedance may also be realized by using a small Varicap (diode) block in parallel, providing an AC parallel path as a function of a tune voltage signal, i.e., using small size Varicaps to ensure a very high resonance frequency.

The added parasitics by the MOS switches are much lower and negligible if compared to those created by the secondary inductors, this being true regardless of whether the secondary inductor is single or multiple. The secondary inductor, i.e., single or multiple, being built with wide metal layers, generates naturally higher parasitic capacitors than the MOS switches. Therefore, for a given and equivalent programmability range, the utilization of the programmable inductor may be performed at much higher frequencies.

The possible degradation of the quality Q-factor may be considered to be an inconvenience due to the parallel impedance influence. However, the degradation may be roughly comparable to implementations that use simple switches. Many applications do not require high levels of Q-factor, such as broadband applications or blocks where linearity or gain/boost programmability specifications are more critical than noise or selectivity aspects.

In order to achieve a wider range of programmable values at a constant area, a dual-turn programmable inductor may be extended to an N-turns programmable inductor. For example, referring to FIG. 4, a 3-turn programmable inductor 400 is shown. The conductor has the form of a 3-turn inductor as shown by turns 402, 404 and 406 and two parallel programmable impedances 408 and 410. This particular configuration offers the additional third turn 406 and the additional parallel programmable impedance 410 to the dual-turn inductor 300, illustrated in FIG. 3. As shown, arrows indicate the direction of the currents in this exemplary 3-turn programmable inductor 400.

For example, if the current in the first turn 402 is i, the current i' in the second turn 404 may be given by the Equation No. 3. The current i'' in the third turn 406 may be given by the following relation:

$$i''=i'-\Delta i'=i-\Delta i-\Delta i'$$  [Equation No. 4]

The impedance values of the parallel programmable impedance 408 and 410 may be modulated by two separated signals, and then current $\Delta i$ and $\Delta i'$ are under control. Referring to the foregoing Equations Nos. 1-4, the inductance value of the inductor 400 is a variable one. By making the impedance value of the programmable impedances 408 and 410 a function of a digital or an analog signal, the inductance value of the inductor 400 is programmable and may be set to as many values as desired in the available range.

Figure 4:
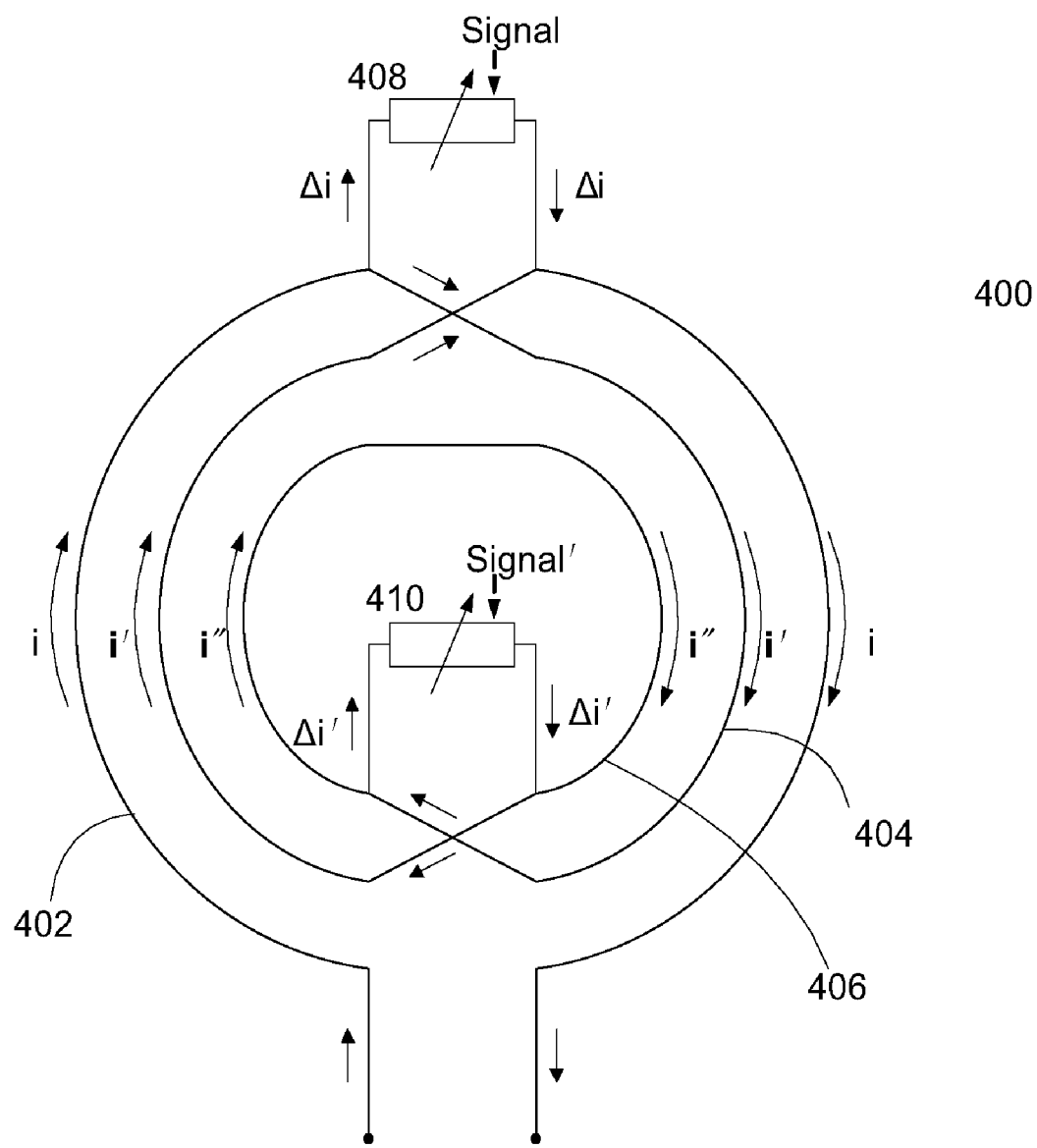
FIG. 4 is a schematic diagram illustrating a 3-turn programmable inductor, according to one of the embodiments of the present invention.

Although in FIG. 4, a 3-turn programmable inductor has been shown and described, it may also be possible to implement more than a 3-turn programmable inductor which enables a much wider inductance value range.

Figure 5A:
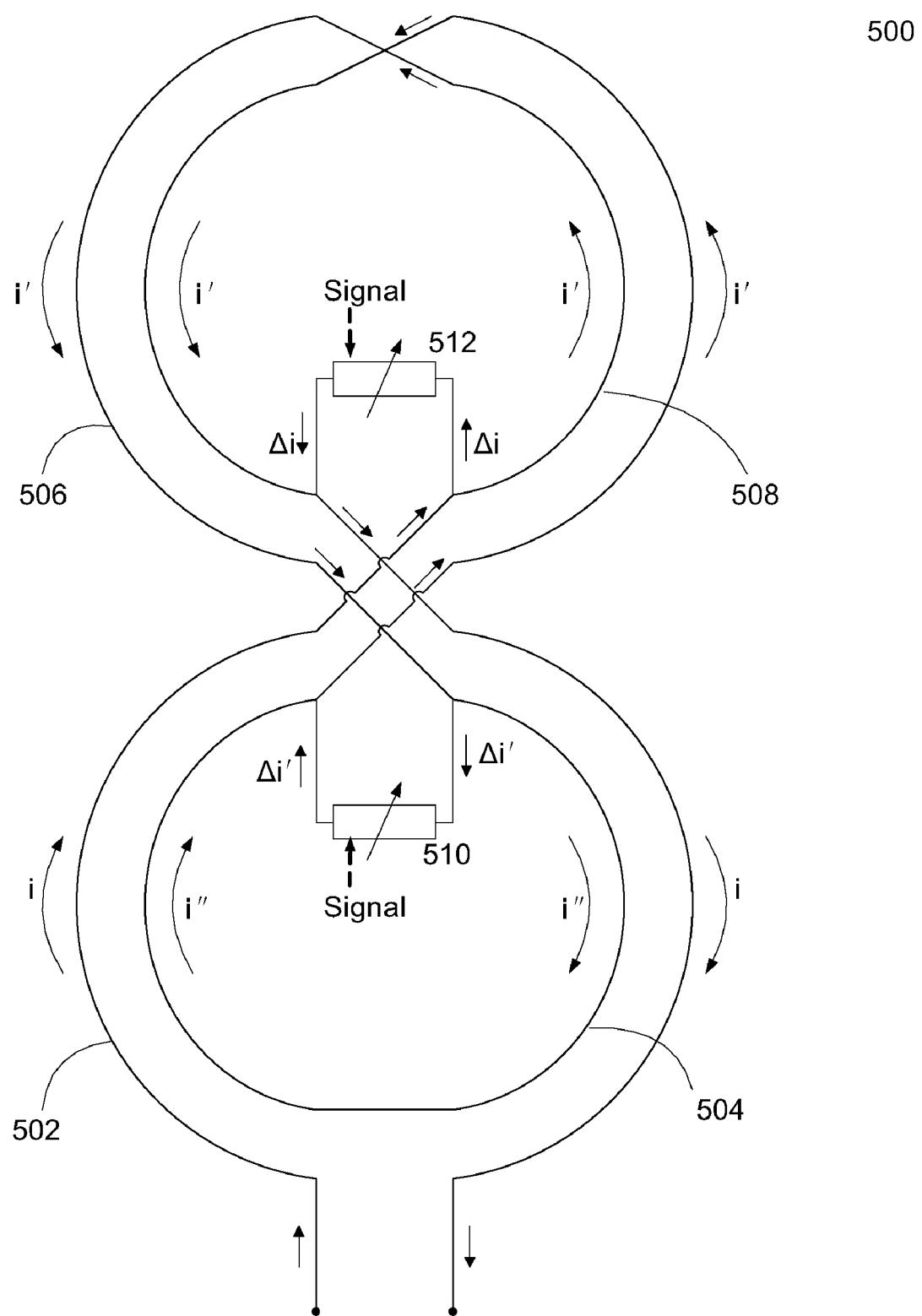
FIG. 5A is a schematic diagram illustrating a figure "8" shaped dual-turn programmable inductor, according to one of the embodiments of the present invention.

Referring now to FIG. 5A, a schematic diagram illustrates a figure-8-shaped dual-turn programmable inductor 500, which presents the features of the previous configurations and further reduced coupling properties. The inductor 500 has the form of a dual-turn figure "8" shaped structure or configuration with two lower dual-turns 502 and 504, upper dual-turns 506 and 508 and two programmable impedances 510 and 512.

By virtue of the figure "8" shape, currents in the upper dual-turns 506 and 508 travel in a direction, e.g., counter-clockwise, that is opposite to the current direction in the lower dual-turns 502 and 504, which happens to be clockwise. Consequently, the figure "8" shape geometry has the advantage that the magnetic fields which emanate from the lower dual-turns 502 and 504 and the upper dual-turns 506 and 508 have opposing directions. As a result, the coupling properties are reduced.

Still referring to FIG. 5A, if the current in the lower dual-turn 502 is i, the current i' in the upper dual-turns 506 and 508 may be given by the Equation No. 3, and the current i'' in the lower dual-turn 504 may be given by the Equation No. 4. With respect to Equations Nos. 1 and 2, the inductance value of the inductor 500 is variable by modulating the impedance values of the programmable impedances 510 and 512. By making the impedance value of the programmable impedances 510 and 512 a function of a digital or an analog signal, the inductance value of the inductor 500 is programmable and can be set to as many values as desired in the available range.

Figure 5B:
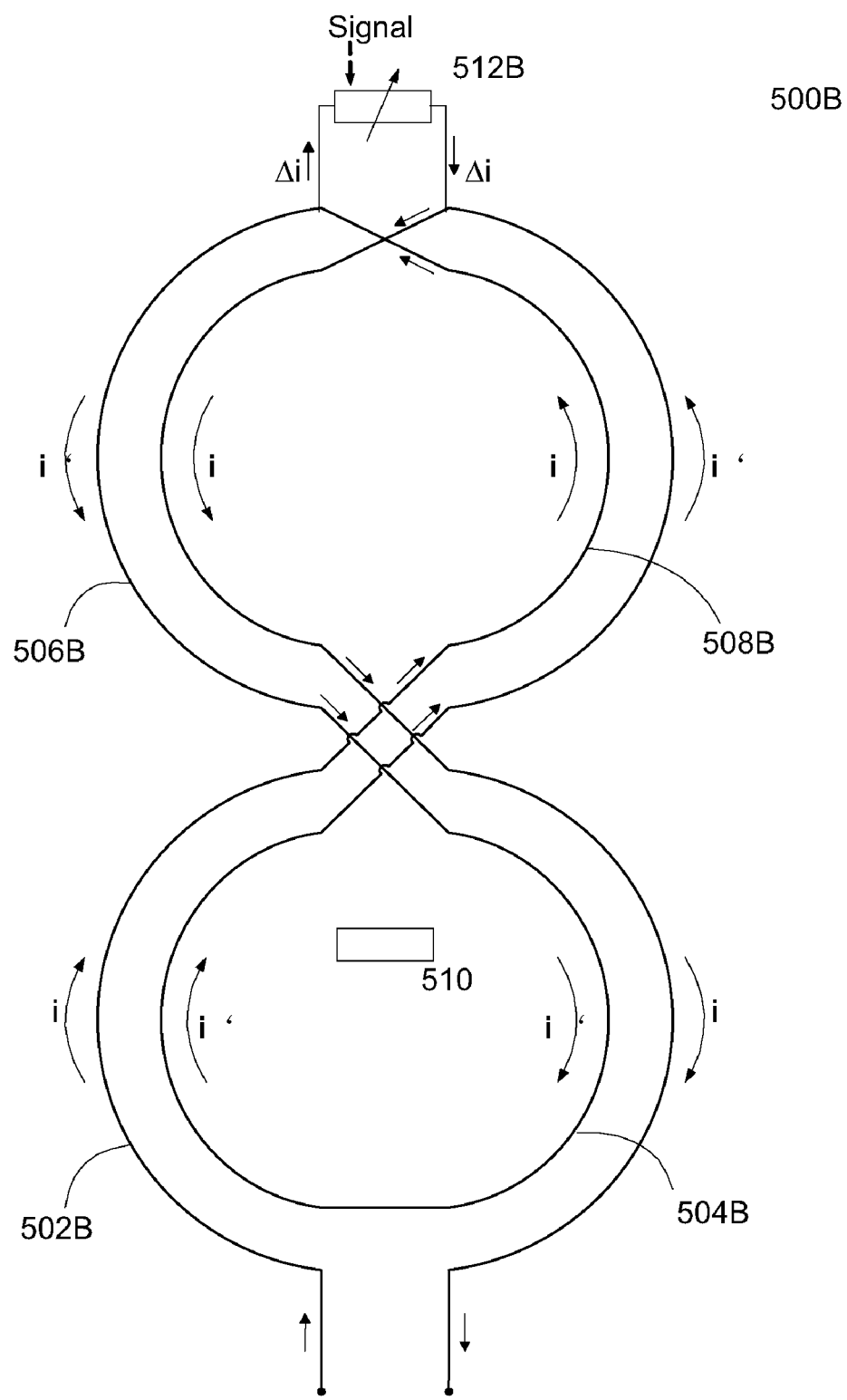
FIG. 5B is a schematic diagram illustrating another derivative figure "8" shaped dual-turn programmable inductor, according to one of the embodiments of the present invention.

Referring now to FIG. 5B, a schematic diagram illustrates another derivative figure "8" shaped dual-turns programmable inductor 500B, which allows more symmetrical current distributions and magnetic fields. The inductor 500B is a derivative inductor from inductor 500 of FIG. 5A. Analogously, inductor 500B has the lower dual-turns 502B and 504B, and upper dual-turns 506B and 508B structure. However, inductor 500B has an variable impedance 512B positioned at the top of the inductor 500B.

By virtue of the figure "8" shape, current in the upper dual-turns travels in a direction opposite to the current in the lower dual-turns. If the current in the lower dual-turn 502B is i, the current in upper turn 508B is still i and the current in the lower turn 504B and upper turn 506B may be i', which can given by the Equation No. 3. With respect to Equations Nos. 1 and 2, the inductance value of the inductor 500B is a variable by modulating the impedance values of the programmable impedances 512B.

Referring back to inductor 500A of FIG. 5, which has i'+i' and i+i'' total currents, respectively, for the upper and lower turns, the values of i'+i' and i+i'' are not identical at all times. With respect to Equation No. 1, the upper and the lower magnetic fields may not be symmetrical, depending on the programmable impedances values. Comparatively, the inductor 500B has i'+i and i+i' total currents, respectively, for the upper and the lower turns. Total currents i'+i and i+i' always have the same value. This results in more symmetrical upper and lower magnetic fields, regardless of the programmable impedance value.

Therefore, inductor 500B in FIG. 5B allows more symmetrical currents distributions and magnetic fields between the upper-turns and the lower-turns. Consequently, this improves the external magnetic and coupling suppression properties for the inductor 500B configuration.

Although the figure "8" shape dual-turn programmable inductor has been shown and described above with reference to FIG. 5B, it is also possible to implement a derivative figure "8" shaped N-turn programmable inductor which enables a wider inductance value range.

An implementation of a programmable dual-turn inductor using an NMOS transistor as a parallel impedance has been carried out over a test-chip. For example, the NMOS size may be W=150 μm, L=0.25 μm, stripes=5. In this example, the programmable dual-turn inductor includes a dual-turn inductor and a NMOS used as a parallel impedance and an inductor control pad. The impedance control is made with a voltage potential applied directly on the gate.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many advanced modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims and their equivalents.

The invention claimed is:

1. A programmable integrated inductor comprising:
a dual-turn inductor comprising at least one inner turn and at least one outer turn, wherein a current generated by the at least one inner and a current generated by the at least one outer turn have a same direction; and
at least one parallel programmable impedance located at an opposite end of the programmable integrated inductor from an input thereof configured to change an impedance value and an inductance value of the inductor, wherein the impedance value is a variable based as a function of a digital or an analog signal and the inductance value is programmable so that its range may be set to an unlimited number of values, and wherein the programmable impedance is coupled between a first inner turn to outer turn transition and a second inner turn to outer turn transition.

2. The programmable inductor of claim 1, wherein the current in the at least one inner turn is configured to generate a magnetic field B1 and the current in the at least one outer turn is configured to generate a magnetic field B2.

3. The programmable inductor of claim 1, wherein the range of values of the programmable inductor is configured to increase without increasing inductor dimensions.

4. The programmable inductor of claim 1, wherein the variable impedance may be implemented using a programmable trans-conductance or impedance device.

5. The programmable inductor of claim 1, wherein the variable impedance may be implemented using a Varicap block in parallel, providing an AC parallel path as a function of a tune voltage signal.

6. The programmable inductor of claim 1, wherein the dual-turn inductor comprises N number of turns.

7. The programmable inductor of claim 1, wherein the dual-turn inductor comprises a "figure eight" shape and further comprises at least one lower dual-turn and at least one upper dual-turn.

8. The programmable inductor of claim 1 further comprising a NMOS transistor configured as the parallel impedance and an inductor control pad, wherein its impedance control is made with a voltage potential applied directly on a gate.

9. A method of manufacturing a programmable integrated inductor, comprising:
forming a dual-turn inductor comprising at least one inner turn and at least one outer turn, wherein a current generated by the at least one inner and a current generated by the at least one outer turn have a same direction; and
forming at least one parallel programmable impedance located at an opposite end of the programmable integrated inductor from an input thereof configured to change an impedance value and an inductance value of the inductor, and wherein the impedance value is a variable based as a function of a digital or an analog signal and the inductance value is programmable so that its range may be set to an unlimited number of values, and wherein the programmable impedance is coupled between a first inner turn to outer turn transition and a second inner turn to outer turn transition.

10. The method of claim 9, wherein the current in the at least one inner turn generates a magnetic field B1 and the current in the at least one outer generates a magnetic field B2.

11. The method of claim 9, further comprising using a programmable trans-conductance or impedance device to implement the variable impedance.

12. The method of claim 9, wherein the dual-turn inductor comprises N number of turns.

13. The method of claim 9, wherein the dual-turn inductor comprises a "figure eight" shape and further comprises at least one lower dual-turn and at least one upper dual-turn.

14. A wireless communication device comprising a programmable integrated inductor comprising:
a dual-turn inductor comprising at least one inner turn and at least one outer turn, wherein a current generated by the at least one inner and a current generated by the at least one outer turn have a same direction; and
at least one parallel programmable impedance configured to change an impedance value and an inductance value of the inductor, wherein the impedance value is a variable based as a function of a digital or an analog signal and the inductance value is programmable so that its range may be set to an unlimited number of values, and wherein the programmable impedance is located at an opposite end of the programmable integrated inductor from an input thereof, and wherein the programmable impedance is coupled between a first inner turn to outer turn transition and a second inner turn to outer turn transition.

15. The programmable inductor of claim 14, wherein the range of values of the programmable inductor is configured to increase without increasing inductor dimensions.

16. The programmable inductor of claim 14, wherein the variable impedance may be implemented using a programmable trans-conductance or impedance device.

* * * * *